United States Patent

Ohkawa et al.

[11] Patent Number: 5,945,683
[45] Date of Patent: Aug. 31, 1999

[54] ELECTRON BEAM EXPOSURE DEVICE

[75] Inventors: Tatsuro Ohkawa; Yoshihisa Ooae, both of Kawasaki; Hitoshi Tanaka, Tokyo; Hiroshi Yasuda, Kawasaki, all of Japan

[73] Assignees: Fujitsu Limited, Kawasaki, Japan; Advantest Corporation, Tokyo, Japan

[21] Appl. No.: 08/906,389

[22] Filed: Aug. 5, 1997

[30] Foreign Application Priority Data

Jan. 10, 1997 [JP] Japan .................................. 9-003379

[51] Int. Cl.⁶ ...................................................... H01J 37/63
[52] U.S. Cl. .................................. 250/492.3; 250/423 F; 219/121.27; 313/337
[58] Field of Search .............................. 250/492.3, 492.2, 250/423 R, 427, 423 F; 219/121.27; 313/337, 341

[56] References Cited

U.S. PATENT DOCUMENTS 5,854,490 12/1998 Ooaeh et al. ........................ 250/423 F Primary Examiner—Kiet T. Nguyen
Attorney, Agent, or Firm—Staas & Halsey

[57] ABSTRACT

An electron beam exposure device includes an alignment optical system; an electromagnetic lens system; a stage on which the sample is provided; and an electron gun. The electron gun is comprised of an electron generating source; an electron generating source heating element which generates heat for increasing the temperature of the electron generating source; a supporting member which supports the electron generating source and the electron generating source heating element; and a Wehnelt. The electron beam exposure device is provided with at least one auxiliary heating element located at respective portion thermally connected to the electron generating source heating element.

7 Claims, 15 Drawing Sheets

PRIOR ART

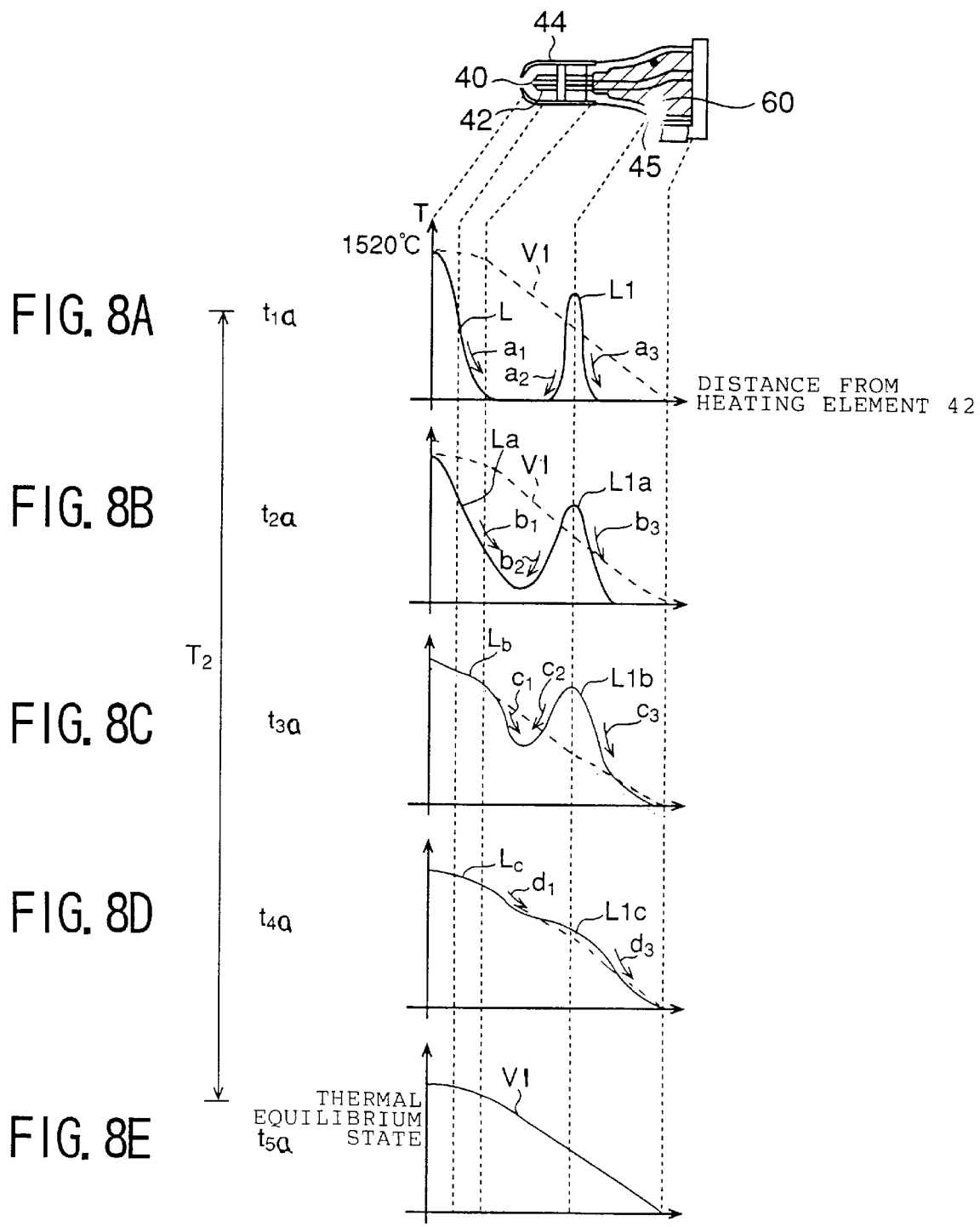

ELECTRON BEAM EXPOSURE DEVICE

BACKGROUND OF THE INVENTION

1. Field of the Invention

The present invention generally relates to electron beam exposure devices, and more particularly, to an electron beam exposure device including a thermoelectron emission type electron gun which is capable of emitting an electron beam upon heating.

2. Description of the Related Art

Recently, demands such as precise forming of an LSI (large-scale integration) circuit pattern which may reliably correspond to a fine structure of an LSI circuit and a high-speed forming of the fine LSI circuit pattern in order to improve a throughput of the circuit have increased for an electron beam exposure device.

In the IC processing technology, it is known that photolithography may form a minimum pattern width of about 0.3 $\mu$m whereas the electron beam irradiation technique may achieve a pattern width less than 0.1 $\mu$m. Therefore, it is more desirable and suitable to use an electron beam exposure device to form highly integrated circuit patterns.

An electron gun is a device, comprising a series of electrodes, that produces an electron beam, usually a narrow beam of high-velocity electrons whose intensity may be controlled by electrodes in the gun.

There are mainly two types of electron gun, one is a thermoelectron emission type and the other is a field emission type. In the thermoelectron emission type electron gun, thermoelectrons are released from a thermoelectron generating source, which is made of an electron emitting material such as $LaB_6$ crystal, when it is heated to about 1500° C. and an electron beam is formed by accelerating the emitted thermoelectrons. In the field emission type electron gun, a needle-like electron generating source whose curvature at a tip is about a few angstrom is provided, and a high electric field is formed around the tip of the electron generating source by applying about −10 to about −50 volts. The high electric field thus formed is capable of reducing the potential barrier at the surface of the emitter and allows electrons to escape from the surface. The distortion of the potential barrier at sufficiently large values of the accelerating field results in an effective narrowing of the barrier and allows the tunnel effect to operate, so liberating more electrons. The electrons thus released are accelerated and an electron beam is formed.

In the electron beam irradiation, a time required for the irradiation is inversely proportional to a current density used. Therefore, it is desirable to employ an electron beam of high current density in order to obtain high throughput of an IC production. Since an electron beam of higher current density is obtainable by the thermoelectron emission type electron gun, compared with the field emission type electron gun, it is preferable to use the thermoelectron emission type electron gun in the production of integrated circuits.

Also, it is important in the practical process of the IC production to improve the operation efficiency of the electron beam exposure device. For instance, the electron beam irradiation operation should be restarted as soon as possible after the completion of maintenance processes. As will be described later, it is necessary to take into account the effect of heat which is used to heat up the thermoelectron generating source to about 1500° C. when restarting the electron beam irradiation.

FIG. 1 is a schematic diagram for explaining a conventional electron beam exposure device 10. The electron beam exposure device 10 is comprised of a mirror cylinder 11, a thermoelectron emission type electron gun 12, a vacuum chamber 13, a stage 14 and a control circuit 15. The thermoelectron emission type gun 12 is provided at the upper portion 48 of the mirror cylinder 11 and the stage 14 is located in the vacuum chamber 13 which is provided at the bottom of the mirror cylinder 11. In the mirror cylinder 11, an alignment coil 20, a first electromagnetic lens 21, an aperture 22, a second electromagnetic lens 23, a third electromagnetic lens 24, an aperture 25, a fourth electromagnetic lens 26 and a deflector 27 are provided in that order from the top. A Faraday cylinder (Faraday cup) 28 for measuring current of an electron beam is provided at a predetermined position of the stage 14.

The control circuit 15 is comprised of a computer unit 30, an electron gun driving circuit 31, a pattern correction circuit 33 and a stage control unit 34.

FIG. 2 is a diagram showing a cross section of the electron gun 12 in FIG. 1 in a magnified scale. As shown in FIG. 2, the electron gun 12 is comprised of a cathode 40, an anode 41, a cathode heating element 42, a supporting member 43, a Wehnelt 44, a base 45, a cover 46 and an insulating oil 47. The cathode 40 may be made of a $LaB_6$ crystal and the cathode heating element 42 is provided on both sides of the cathode 40. The supporting member 43 supports the cathode 40 and the cathode heating element 42 and the Wehnelt 44 is provided so as to surround and support the support member 43. The Wehnelt 44 is fixed to the base 45 having a substantially inverted cone shape, which may be made of ceramics, and the cover 46 of a plate shape is provided at the top of the base 45 in which the insulating oil 47 is contained.

The portion of the thermoelectron emission type electron gun 12 around the cover 46 is fixed to the upper portion 48 of the mirror cylinder 11 so that the thermoelectron emission type electron gun 12 is entirely contained in the mirror cylinder 11.

In the electron beam exposure device 10 comprising the thermoelectron emission type electron gun 12 which has the configuration mentioned above, thermoelectrons are released from the cathode 40 when the electron gun driving circuit 31 supplies a current, $i_1$, for heating the cathode 40 to the cathode heating element 42 so as to heat up the cathode heating element 42 through which about five to 12 watts of heat quantity are given to the cathode 40 so that the temperature of the cathode 40 may be increased to about 1520° C. The released thermoelectrons are accelerated by the anode 41 so that an electron beam 49 is formed, and the electron beam 49 may be irradiated onto a wafer 50 having been coated with a resist and fixed on the stage 14, so that a patterning operation may be performed.

As indicated by the arrows 55 in FIG. 2, the heat generated by the cathode heating element 42 is also transferred to the supporting member 43, the Wehnelt 44 and the base 45 and increases the temperature thereof. Also, the heat transferred to the supporting member 43 and the Wehnelt 44 passes through the base 45 and is transferred to the upper portion 48 of the mirror cylinder 11 where it is emitted to the surrounding atmosphere.

However, when the temperature of the Wehnelt 44 of the thermoelectron emission type electron gun 12 is changed, factors such as the positional relationship between the cathode 40 and the Wehnelt 44, and the setting angle of the electron gun 12 is gradually varied due to the thermal expansion of the Wehnelt 44. Thus, the emission angle or the emission direction of the electron beam is changed and the crossover position is varied.

Also, when the temperature of the base 45 and the upper portion 48 of the mirror cylinder 11 is changed, the incident position and the incident angle of the electron beam emitted from the electron gun 12 with respect to the alignment coil 20 is varied. Thus, the deflection property of the alignment coil 20 is changed, and ultimately the irradiation position of the electron beam to the wafer 50 and the current density of the electron beam are varied.

If any of the crossover position, the irradiation position and the current density of the electron beam are changed by the cause as mentioned above in the thermoelectron emission type electron gun 12, the accuracy of the electron beam irradiation with respect to the wafer 50 is lowered.

Therefore, it is necessary to carry out the maintenance operation of the electron beam exposure device 10 as mentioned above. Although it is preferable to restart the electron beam exposure device 10 immediately after the maintenance operation in order to improve the efficiency in the IC production, it is necessary to wait for a temperature stabilization of the Wehnelt 44, the base 45 and the upper portion 48 of the mirror cylinder 11 for the reasons mentioned above. That is, it is necessary to wait for the electron gun 12 to reach the thermal equilibrium state in order to restart the electron beam irradiation.

FIGS. 3A through 3F are diagrams for explaining the steps through which the temperature of the entire electron gun 12 reaches a thermal equilibrium state when heated by the heating element. In FIGS. 3A through 3F, the time, $t_1$, at which the temperature of the cathode 40 of the electron gun 12 reaches 1520° C. heated by the cathode heating element 42, is used as a criterion. It is shown in the figures that as the time is elapsed ($t_2$, $t_3$, ...), the temperature of the Wehnelt 44 and the base 45, respectively, is gradually increased and the temperature distribution of the electron gun 12 is changed in order of I→II→III→IV→V and reaches the thermal equilibrium state indicated by a line VI at time $t_6$ as shown in FIG. 3F. After the time $t_6$, the thermal equilibrium state indicated by the line VI of the electron gun 12 may be maintained in the electron beam exposure device 10.

In the above steps shown in FIG. 3A to 3F, the total time from time $t_1$ to time $t_6$ is about 12 hours, which is considered to be significantly large, due to the large heat capacity of the electron gun 12 including the upper portion 48 of the mirror cylinder 11. In the practical process, a final checking and adjustment operation of an optical system is carried out after the time $t_6$, and the electron beam irradiation is started.

Thus, in the actual operation of the electron beam exposure device 10, more than one day to is required to restart the device 10 after the completion of the maintenance operation. Accordingly, the operation efficiency of the electron beam exposure device 10 is low and the throughput of the IC production is decreased.

FIG. 4 is a graph showing the temperature change of the electron beam exposure device 10 after its operation is started (i.e., the time $t_0$ at which the power source is switched on and the cathode heating element 42 is about to generate the heat—this is slightly before the above-mentioned time $t_1$.) The temperature of the outside of the electron beam exposure device 10 is measured. The line indicated by $X(P_1)$ indicates the temperature change of the position $P_1$ of the upper portion 48 of the mirror cylinder 11 as shown in FIG. 1 and the line $XI(P_2)$ indicates the temperature change of the position $P_2$ on the mirror cylinder 11. Likewise, the line $XII(P_3)$ indicates the temperature change at the position $P_3$ in a room where the electron beam exposure device 10 is located. As can be seen from the graph, the temperature of the upper portion 48 of the mirror cylinder 11 indicated by the line $XI(P_1)$ is stabilized after 12 hours from the time $t_0$.

SUMMARY OF THE INVENTION

Accordingly, it is a general object of this invention to provide an electron beam exposure device in which the above-mentioned problems are eliminated.

A more specific object of the present invention is to provide an electron beam exposure device by which the time that can be used for an electron beam irradiation operation may be relatively increased by decreasing the time required for an electron gun provided in the electron beam exposure device to reach a thermal equilibrium state.

Another object of the present invention is to provide an electron beam exposure device having excellent reliability and stability.

Still another object of the present invention is to provide a method for irradiating an object with an electron beam using an electron beam exposure device by which an electron beam irradiation operation may be carried out before the electron gun reaches a thermal equilibrium state.

Yet another object of the present invention is to provide a method for irradiating an object with an electron beam using an electron beam exposure device by which the efficiency in, for example, IC production, may be improved.

The objects described above are achieved by an electron beam exposure device comprising: an electron gun; an alignment optical system; an electromagnetic lens system; and a stage on which a sample is provided, the electron gun including: an electron generating source; an electron generating source heating element which generates heat for increasing the temperature of the electron generating source; a supporting member which supports the electron generating source and the electron generating source heating element; and a Wehnelt, wherein at least one auxiliary heating element is provided at a respective portion thermally connected to the electron generating source heating element.

According to the above electron beam exposure device, since at least one auxiliary heating element is provided at a respective portion thermally connected to the electron generating source heating element, it becomes possible to reduce the time required for the electron gun to reach the thermal equilibrium state. That is, the time necessary for starting an electron beam irradiation operation after the power is supplied to the device may be reduced as compared with that of a conventional electron beam exposure device. Thus, the time that can be used for an electron beam irradiation operation may be relatively increased and the efficiency in IC production may be improved.

The objects described above are also achieved by the electron beam exposure device, further comprising an auxiliary heating element heating means for controlling a heating of at least one auxiliary heating element.

The objects described above are also achieved by the electron beam exposure device, wherein the auxiliary heating element heating means controls heat quantity generated by the auxiliary heating element so that the heat quantity generated by the auxiliary heating element may be maintained substantially constant for a predetermined time after the electron generating source heating element starts to generate heat, and the heat quantity generated by the auxiliary heating element is gradually decreased after the predetermined time has elapsed.

According to the above electron beam exposure device, since the heat generated by the auxiliary heating element is maintained substantially constant for a predetermined time after the electron generating source heating element starts to generate heat and then the heat is gradually decreased, it becomes possible to bring the electron gun to a thermal equilibrium state in a short amount of time as compared with a conventional electron beam exposure device.

The objects described above are also achieved by the electron beam exposure device, wherein the auxiliary heating element heating means controls the heat quantity generated by the auxiliary heating element so as to become substantially nil.

According to the above electron beam exposure device, since the heat generated by the auxiliary heating element is maintained substantially constant for a predetermined time after the electron generating source heating element starts to generate heat and then the heat is gradually decreased until it eventually reaches zero, the time required for the electron gun to reach the thermal equilibrium state may be reduced. Also, since no heat is generated from the auxiliary heating element after the certain time period, the temperature of the electron gun in the thermal equilibrium state is closer to the ambient temperature compared with a case in which heat is continuously supplied to the electron gun in the thermal equilibrium state. Thus, the thermal equilibrium state of the electron gun may be maintained more stably according to the present invention.

The objects described above are also achieved by the electron beam exposure device, further comprising a base which supports the Wehnelt, wherein the auxiliary heating element is located in the base.

According to the above electron beam exposure device, the auxiliary heating element may be provided with the electron beam exposure device without providing any additional parts with the device. Thus, the structure of the device may be simplified and the cost necessary for producing the device may be reduced.

The objects described above are also achieved by the electron beam exposure device, further comprising a cylinder member which is provided so as to surround at least the electron gun, wherein at least one cooling-water pathway is provided in the cylinder member.

According to the above electron beam exposure device, since the electron beam exposure device further includes at least one cooling-water pathway provided in the cylinder member, the electron beam exposure device is less effected by the room (outside) temperature when the temperature is changed, and hence the thermal equilibrium state of the device (electron gun) may be more stabilized.

The objects described above are achieved by an electron beam exposure device comprising: an electron gun; an alignment optical system; an electromagnetic lens system; a stage on which a sample is provided; and a computer unit, the electron gun including: an electron generating source; an electron generating source heating element which generates heat for increasing the temperature of the electron generating source; a supporting member which supports the electron generating source and the electron generating source heating element, a Wehnelt, and a base which supports the Wehnelt, wherein the computer unit executes a computer program so as to perform an electron beam irradiation operation when the alignment optical system is adjusted and before the electron gun reaches a thermal equilibrium state.

According to the above electron beam exposure device, since the computer unit executes a computer program so as to perform an electron beam irradiation operation when the alignment optical system is adjusted and before the electron gun reaches a thermal equilibrium state, an electron beam irradiation operation may be carried out intermittently prior to the thermal equilibrium state of the electron gun. Thus, the time that can be used for an electron beam irradiation operation may be relatively increased and the efficiency in IC production may be improved.

The objects described above are achieved by a method for irradiating an object with an electron beam using an electron beam exposure device whereby an electron beam irradiation operation may be performed when an alignment optical system is adjusted and before an electron gun reaches a thermal equilibrium state, the method comprising steps of: carrying out an adjustment operation of the alignment optical system with a constant time interval after the electron beam exposure device is turned on, and storing a deflection quantity and an excitation current at each adjustment operation in a memory, reading the deflection quantity and the excitation current of a latest adjustment operation to an adjustment operation performed a certain time before from the memory, obtaining an approximate function by carrying out a least-squares approximation based on the deflection quantity and the excitation current read from the memory, obtaining an expected deflection quantity and an expected excitation current by substituting the latest deflection quantity and excitation current in the approximate function, and using the expected deflection quantity and the expected excitation current for the alignment optical system.

The objects described above are also achieved by the method for irradiating an object with an electron beam using an electron beam exposure device wherein the approximate function is obtained by carrying out a least-squares approximation.

The objects described above are also achieved by the method for irradiating an object with an electron beam using an electron beam exposure device further comprising a step of: using an obtained value of deflection quantity and excitation current, respectively, at a latest adjustment operation as the deflection quantity and the excitation current for the alignment optical system after the electron gun reaches a thermal state close to an equilibrium state.

According to the above method for irradiating an object with an electron beam, since an expected deflection quantity and expected excitation current may be obtained by substituting the latest deflection quantity and the excitation current in a corresponding approximate function and the alignment optical system is adjusted based on the expected deflection quantity and the expected excitation current, it is possible to extend the time period in which the accuracy of electron beam irradiation may be maintained within a practically allowable range. Thus, an electron beam irradiation operation may be carried out intermittently prior to the thermal equilibrium state of the electron gun, and hence, the time that can be used for an electron beam irradiation operation may be relatively increased and the efficiency in IC production may be improved.

Other objects and further features of the present invention will be apparent from the following detailed description when read in conjunction with the accompanied drawings.

BRIEF DESCRIPTION OF THE DRAWINGS

FIG. 8A is a diagram for showing a change of temperature of the Wehnelt and the base of the electron gun with respect to time;

FIG. 8B is a diagram for showing a change of temperature of the Wehnelt and the base of the electron gun with respect to time;

FIG. 8C is a diagram for showing a change of temperature of the Wehnelt and the base of the electron gun with respect to time;

FIG. 8D is a diagram for showing a change of temperature of the Wehnelt and the base of the electron gun with respect to time;

FIG. 8E is a diagram for showing a change of temperature of the Wehnelt and the base of the electron gun with respect to time;

DESCRIPTION OF THE PREFERRED EMBODIMENTS

In the following, a principle and an embodiment of the present invention will be described with reference to the accompanying drawings.

Figure 1:
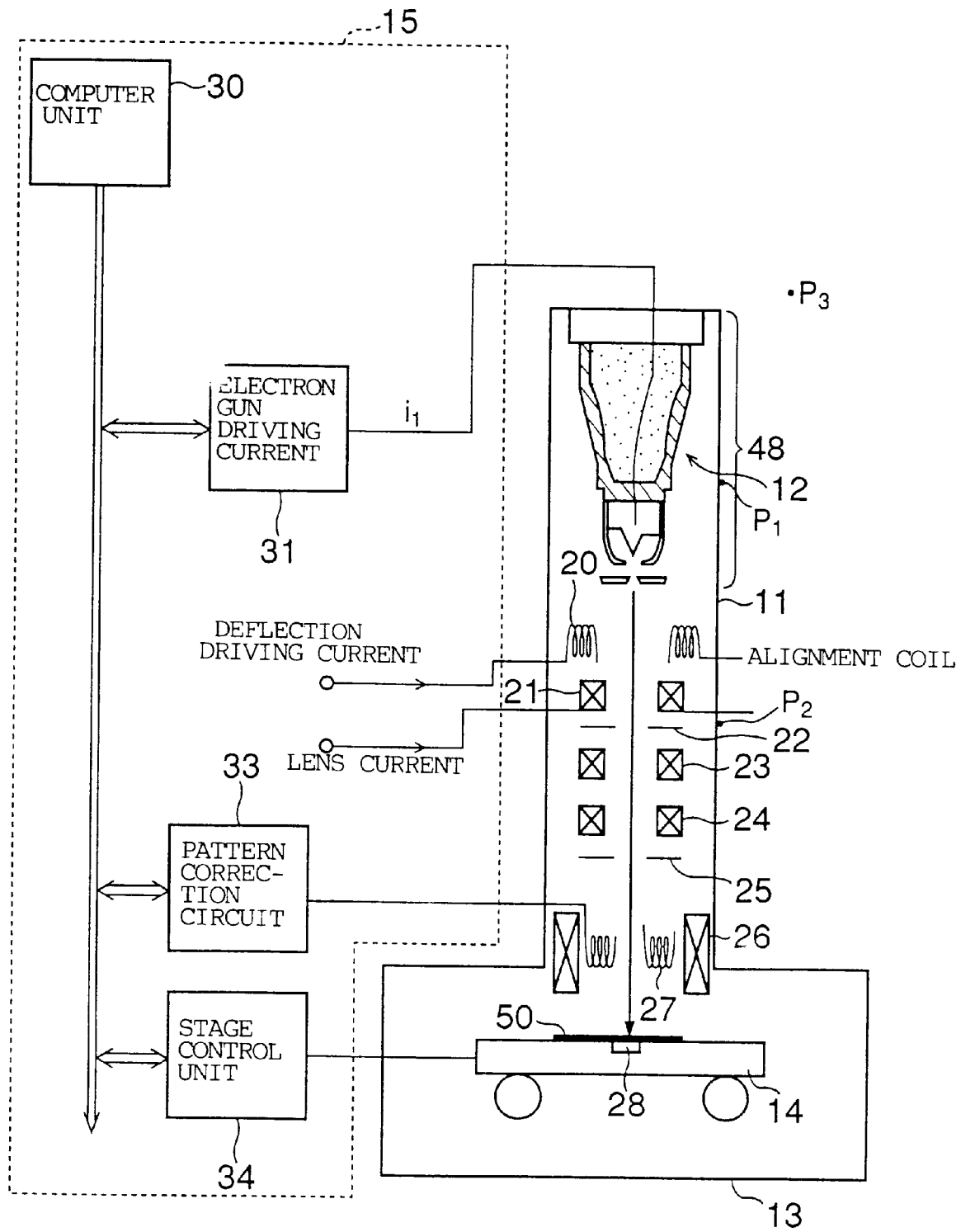
FIG. 1 is a schematic diagram for explaining a conventional electron beam exposure device.
Figure 2:
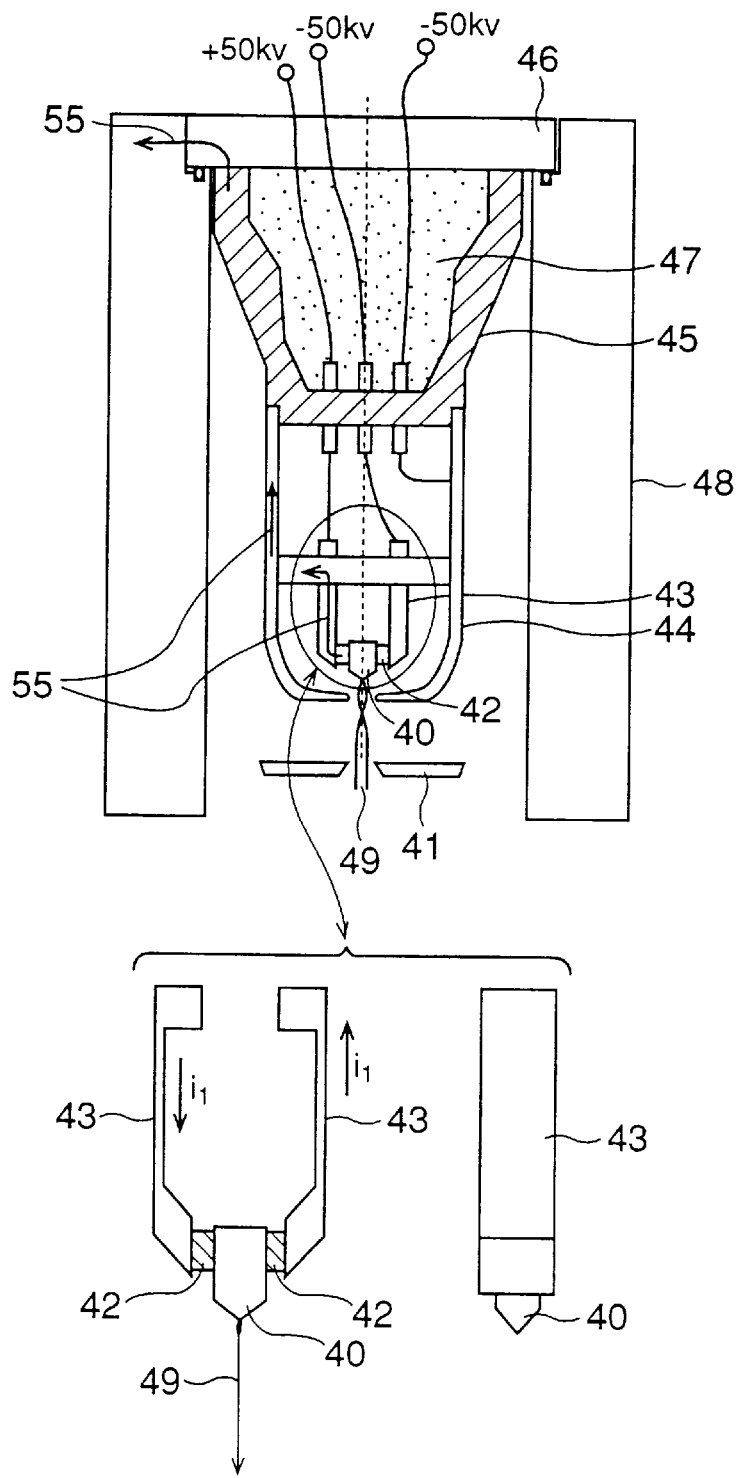
FIG. 2 is a diagram showing a cross section of an electron gun shown in FIG. 1 in a magnified scale.
Figure 3:
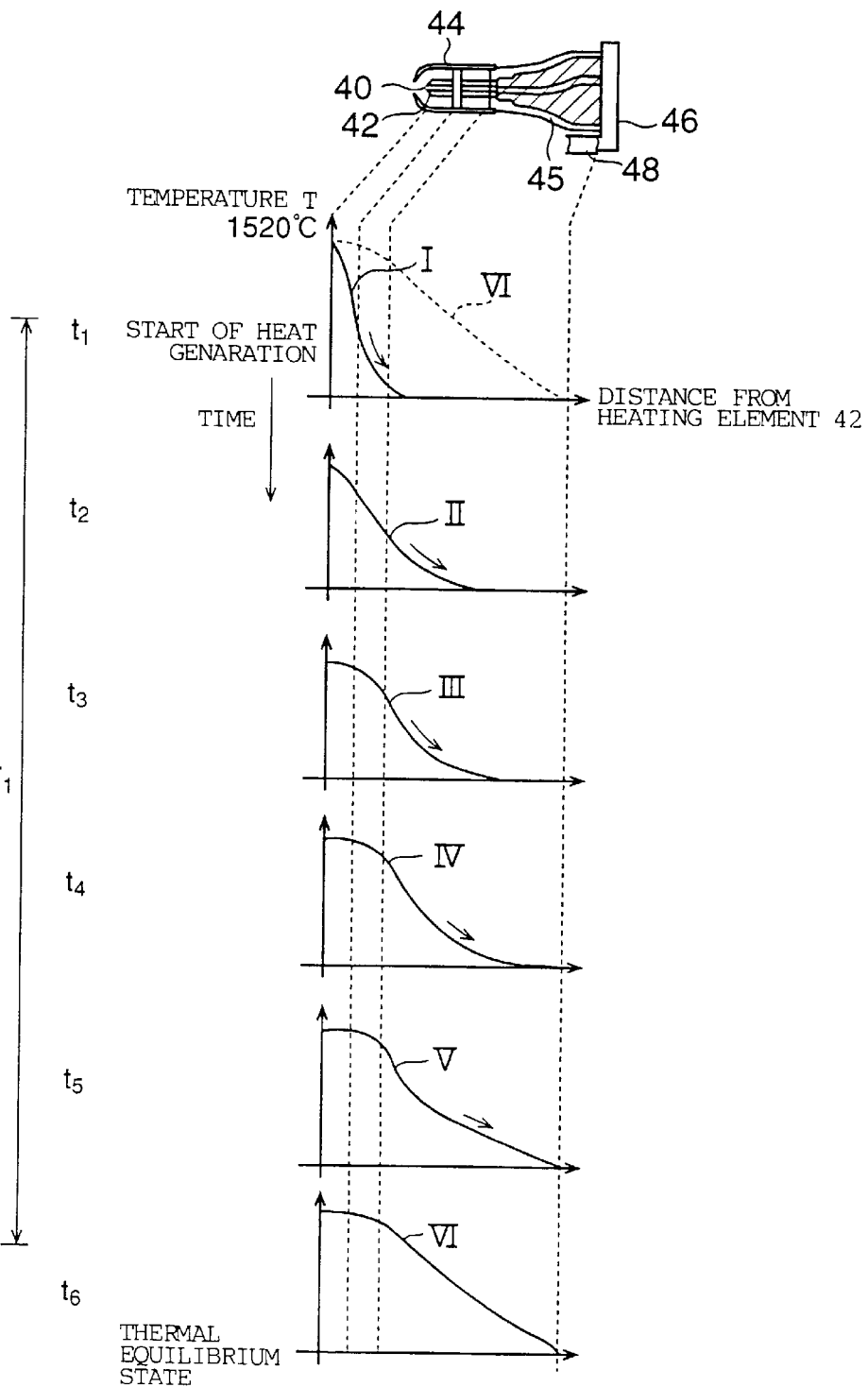
FIG. 3A is a diagram for explaining a step through which the temperature of the entire electron gun reaches a thermal equilibrium state when heated by a heating element.
FIG. 3B is a diagram for explaining a step through which the temperature of the entire electron gun reaches the thermal equilibrium state when heated by the heating element.
FIG. 3C is a diagram for explaining a step through which the temperature of the entire electron gun reaches the thermal equilibrium state when heated by the heating element.
FIG. 3D is a diagram for explaining a step through which the temperature of the entire electron gun reaches the thermal equilibrium state when heated by the heating element.
FIG. 3E is a diagram for explaining a step through which the temperature of the entire electron gun reaches the thermal equilibrium state when heated by the heating element.
FIG. 3F is a diagram for explaining a step through which the temperature of the entire electron gun reaches the thermal equilibrium state when heated by the heating element.
Figure 4:
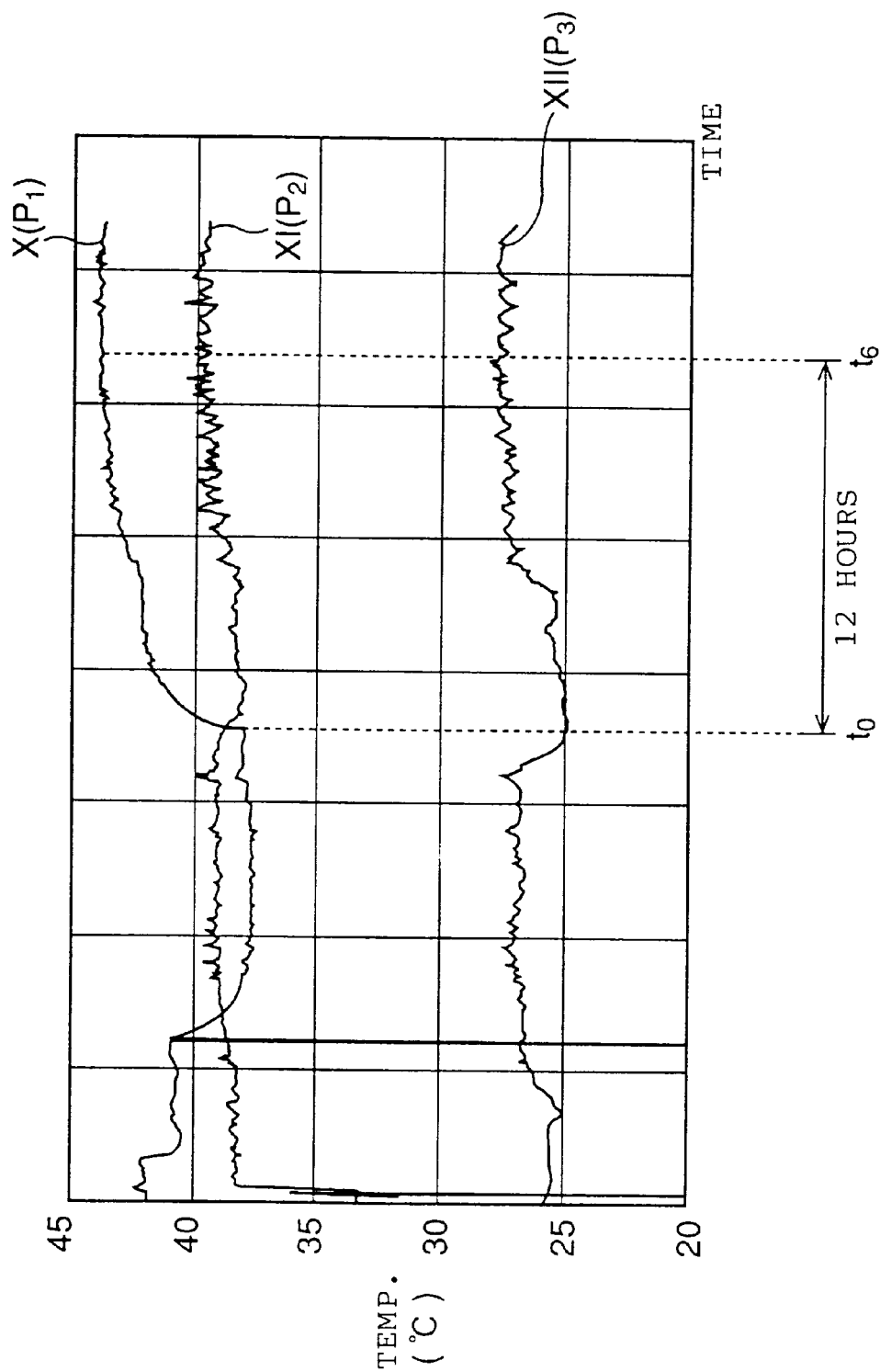
FIG. 4 is a graph showing a temperature change of the electron beam exposure device after its operation is started.
Figure 5:
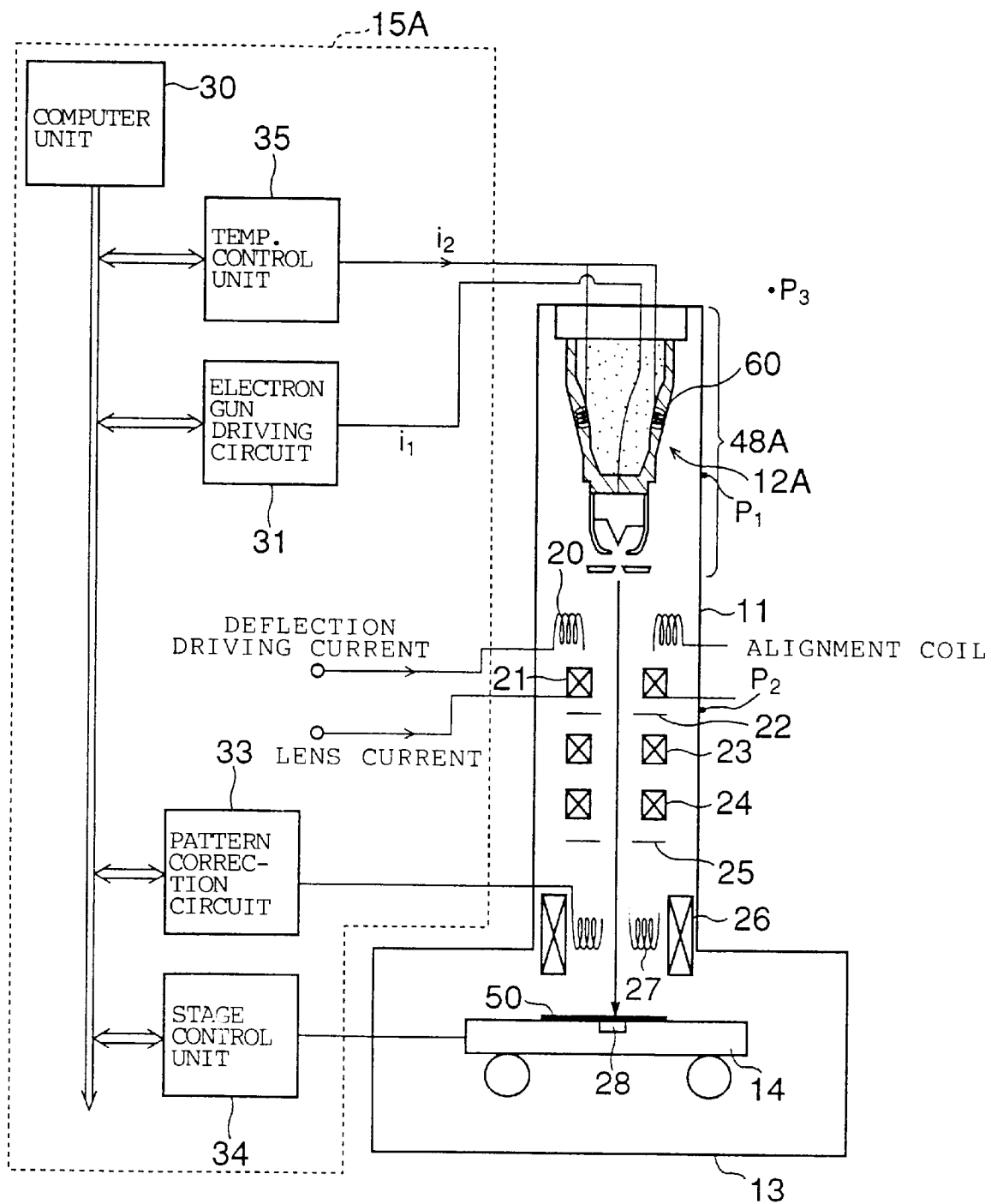
FIG. 5 is a diagram showing an electron beam exposure device according to a first embodiment of the present invention.

FIG. 5 is a diagram showing an electron beam exposure device 10A according to a first embodiment of the present invention. In FIG. 5, elements which are the same as the ones in FIG. 1 are indicated by the same reference numerals.

The electron beam exposure device 10A shown in FIG. 5 is comprised of a mirror cylinder 11, a thermoelectron emission type electron gun 12A, a vacuum chamber 13, a stage 14 and a control circuit 15A. The thermoelectron emission type gun 12A is provided at the upper portion 48A of the mirror cylinder 11 and the stage 14 is located in the vacuum chamber 13 which is provided at the bottom of the mirror cylinder 11. In the mirror cylinder 11, an alignment coil 20, 21, a first electromagnetic lens 21, an aperture 22, a second electromagnetic lens 23, a third electromagnetic lens 24, an aperture 25, a fourth electromagnetic lens 26 and a deflector 27 are provided in that order from the top. A Faraday cylinder (Faraday cup) 28 for measuring current of an electron beam is provided at a predetermined position of the stage 14.

The control circuit 15A is comprised of a computer unit 30, an electron gun driving circuit 31, a pattern correction circuit 33, a stage control unit 34 and a temperature control unit 35.

Figure 6:
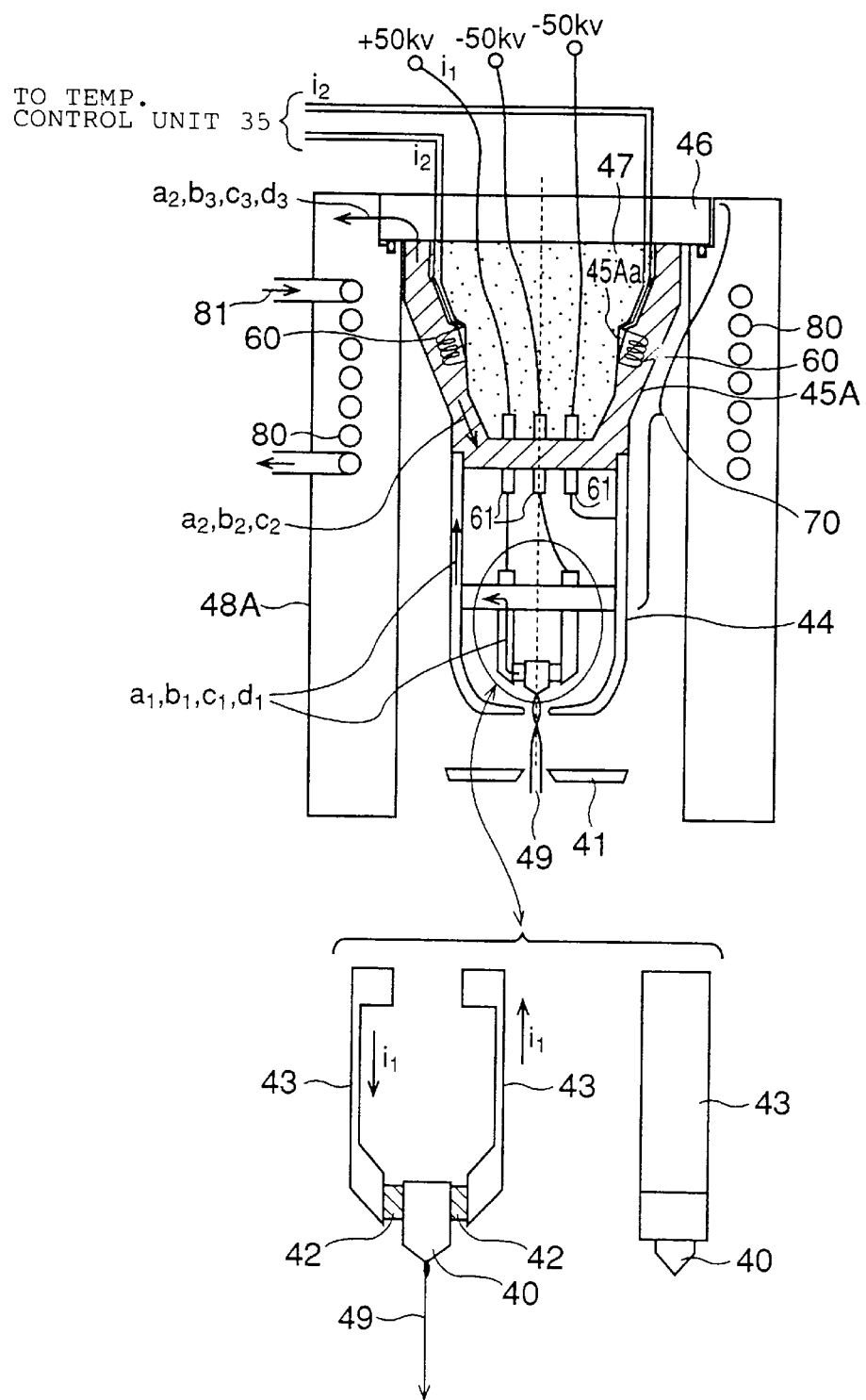
FIG. 6 is a diagram showing a cross-section of the electron gun shown in FIG. 5 in a magnified scale.

FIG. 6 is a diagram showing a cross section of the electron gun 12A shown in FIG. 5 in a magnified scale. As shown in FIG. 6, the electron gun 12A is comprised of a cathode 40, an anode 41, a cathode heating element 42, a supporting member 43, a Wehnelt 44, a base 45A, a cover 46, an insulating oil 47, and a plurality of auxiliary heating elements 60. The cathode 40 may be made of a $LaB_6$ crystal and the cathode heating element 42 is provided on both sides of the cathode 40. The supporting member 43 supports the cathode 40 and the cathode heating element 42 and the Wehnelt 44 is provided so as to surround and support the support member 43. The base portion of the Wehnelt 44 is fixed to the base 45A having a substantially inverted cone shape, which may be made of ceramics, and the cover 46 of a plate shape is provided at the top of the base 45A in which the insulating oil 47 is contained.

The portion of the thermoelectron emission type electron gun 12A around the cover 46 is fixed to the upper portion 48A of the mirror cylinder 11 so that the thermoelectron emission type electron gun 12A is entirely contained in the mirror cylinder 11.

The plurality of the auxiliary heating elements 60 are made of carbon coil so that no effect is exerted on the magnetic field. The auxiliary heating elements 60 are embedded in the center of a cylinder portion 45Aa of the base 45A so that each of them is distributed in a circumference direction. The cylinder portion 45Aa of the base 45A has a convex part protruding in the inside direction so that the plurality of the auxiliary heating elements may be embedded.

Also, the cylinder portion 45Aa of the base 45A forms a thermal conduction pathway 70 shown in FIG. 6 through which the heat in the Wehnelt 44 (i.e., the heat generated by the cathode heating element 42) is transferred to the outside of the electron gun 12A (to the upper portion 48A of the mirror cylinder 11). The plurality of the auxiliary heating elements 60 are located in the middle of the thermal conduction pathway 70.

Moreover, the above-mentioned temperature control unit 35 is connected to the plurality of the auxiliary heating elements 60 and a cooling-water pathway 80 of a helical shape is provided inside of the upper portion 48A of the mirror cylinder 11.

In the electron beam exposure device 10A comprising the thermoelectron emission type electron gun 12A which has the configuration mentioned above, the electron gun driving circuit 31 supplies a current, $i_1$, for heating the cathode 40 to the cathode heating element 42 by the order of the computer unit 30 while a cooling water 81 of a predetermined constant temperature is passed through the cooling-water pathway 80. Thus, the cathode heating element 42 is heated and it provides about five to 12 watts of heat quantity to the cathode 40 so that the temperature of the cathode 40 may be increased to about 1520° C. and thermoelectrons are released from the cathode 40. The released thermoelectrons are accelerated by the anode 41 so that an electron beam 49 is formed, and the electron beam 49 may be irradiated onto a wafer 50 having been coated with a resist and fixed on the stage 14, so that a patterning operation may be performed.

Next, a restart operation of an electron beam irradiation using the electron beam exposure device 10A after the completion of a maintenance operation which is performed while the operation of the electron beam exposure device 10A is stopped will be explained with reference to FIGS. 7A through 8E.

FIGS. 7A through 7D are graphs showing values of current and generated heat in the electron gun 12A with respect to time. FIGS 8A through 8E are diagrams for showing a change of temperature of the Wehnelt 44 and the base 45A of the electron gun 12A with respect to time. In FIGS. 8A through 8E, each of the graphs is constructed based on a time $t_{1a}$ at which the center of the cylinder portion 45Aa of the base 45A has just started being heated when the temperature of the cathode is increased to about 1520° C. by the cathode heating element 42 and the auxiliary heating elements 60.

When the electron beam exposure device 10A is restarted after a maintenance operation, the electron gun driving circuit 31 starts to supply the current, $i_1$, for heating the cathode 40 to the cathode heating element 42 by the order of the computer unit 30 as mentioned above. At the same time, the temperature control unit 35 starts to output a current, $i_2$, for heating the auxiliary heating elements 60, which current is supplied to the auxiliary heating elements 60.

Figure 7A:
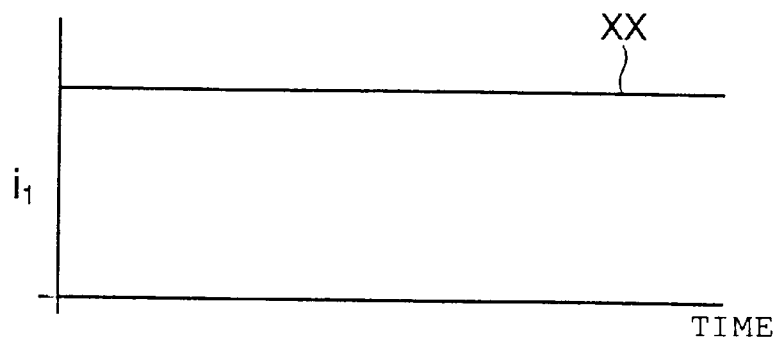
FIG. 7A is a graph showing the value of a current $i_1$ for heating the cathode with respect to time.

FIG. 7A is a graph showing the value of a current $i_1$, which is output by the electron gun driving circuit 31 for heating the cathode 40, with respect to time. As indicated by the line XX in FIG. 7A, the current $i_1$ for heating the cathode 40 is maintained to be constant. The current $i_1$ passes through the supporting member 43, cathode heating element 42 and the cathode 40 as shown in FIG. 6 and the cathode heating element 42 generates heat as indicated by the line XXII in FIG. 7C, which heat will be constantly supplied to the cathode 40 as a heat quantity equivalent to about five to 12 watts. As a result, the cathode 40 is heated to about 1520° C. as indicated by the line L in FIG. 8A and thermoelectrons are released from the cathode 40.

Figure 7B:
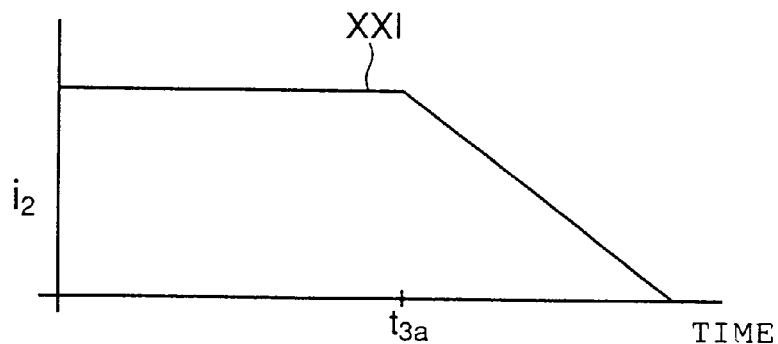
FIG. 7B is a graph showing the value of a current $i_2$ for heating the auxiliary heating element with respect to time.
Figure 7C:
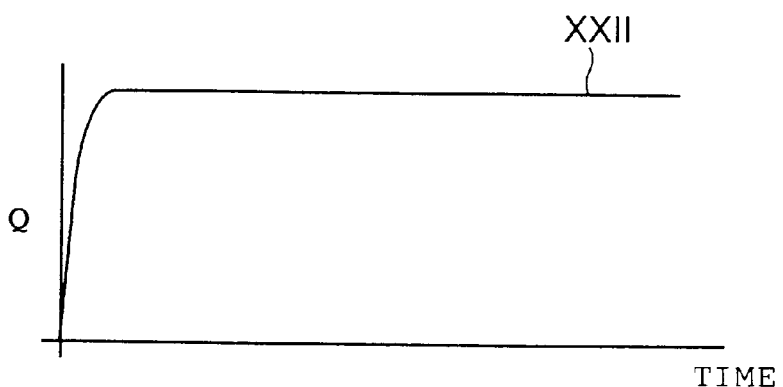
FIG. 7C is a graph showing the quantity of heat generated by the cathode heating element with respect to time.
Figure 7D:
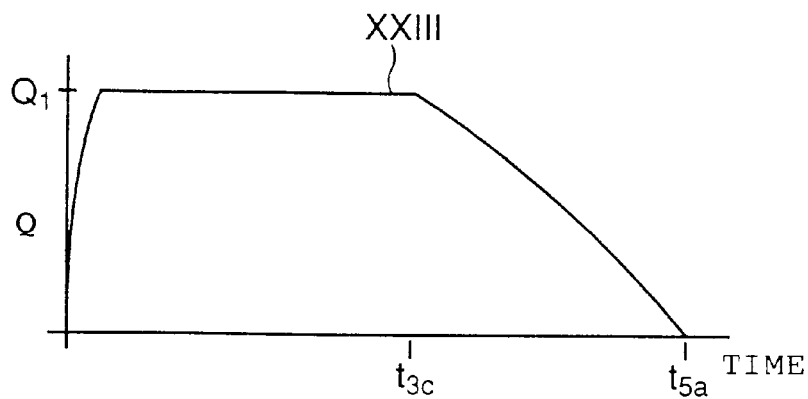
FIG. 7D is a graph showing the quantity of heat generated by the auxiliary heating element with respect to time.

FIG. 7B is a graph showing the value of a current $i_2$ for heating the auxiliary heating element 60 with respect to time. As indicated by the line XX1 in FIG. 7B, the temperature control unit 35 outputs the current $i_2$ so that its value is constant until time $t_{3a}$ and gradually decreases after time $t_{3a}$ and eventually reaches nil. The current $i_2$ is supplied to the auxiliary heating element 60 and the element 60 generates heat as indicated by the line L1 shown in FIG. 8A, which directly heats up the center of the cylinder portion 45Aa of the base 45A. The auxiliary heating element 60 generates heat as indicated by the line XXIII in FIG. 7D. That is, the heat generation of the auxiliary heating element 60 is gradually decreased as the temperature distribution in the electron gun 12A reaches the thermal equilibrium state. Thus, the auxiliary heating element 60 generates heat of value $Q_1$ until time $t_{3a}$ and after time $t_{3a}$ the value is gradually decreased and eventually reaches zero at time $t_{5a}$.

As will be explained later, the above-mentioned operation of the auxiliary heating element 60 functions so as to reduce the time required for the electron gun 12A to reach the thermal equilibrium state. The main reasons for this is that the auxiliary heating element 60 is capable of generating heat of value $Q_1$ until time $t_{3a}$ and of gradually reducing the heat after time $t_{3a}$.

In FIG. 8A, the dotted line VI indicates the temperature distribution of the electron gun 12A when it reaches the thermal equilibrium state (refer to FIG. 8E) and the actual temperature distribution is indicated by the solid line.

At the beginning, the temperature of the portions of the electron gun 12a provided with the cathode heating element 42 or the auxiliary heating element 60 is high—the temperature distribution of the Wehnelt 44 is indicated by the line L and that of the cylinder portion 45Aa is indicated by the line L1—= as shown in FIG. 8A. However, as time is elapsed, the heat generated by the cathode heating element 42 and the auxiliary heating element 60, respectively, is transferred as indicated by the arrows a1, a2, and a3.

At time $t_{2a}$, the temperature distribution of the electron gun 12A becomes as shown in FIG. 8B. That is, the temperature distribution of the Wehnelt 44 is changed to the one indicated by the line La and that of the cylinder portion 45Aa is changed to the one indicated by the line L1a, and the line La and L1a are connected to each other. As time is elapsed, the heat generated by the cathode heating element 42 and the auxiliary heating element 60, respectively, is further transferred as indicated by the arrows b1, b2, and b3.

At time $t_{3a}$, the temperature distribution of the electron gun 12A becomes as shown in FIG. 8C. That is, the temperature distribution of the Wehnelt 44 is changed to the one indicated by the line Lb and that of the cylinder portion 45Aa is changed to the one indicated by the line L1b, and the temperature difference between the two is reduced. As time is elapsed, the heat generated by the cathode heating element 42 and the auxiliary heating element 60, respectively, is further transferred as indicated by the arrows c1, c2, and c3. Also, the current $i_2$ for the auxiliary heating element 60 is reduced as explained above, and hence the temperature of the cylinder portion 45Aa is lowered.

At time $t_{4a}$, the temperature distribution of the electron gun 12A becomes as shown in FIG. 8D. That is, the temperature distribution of the Wehnelt 44 is changed to the one indicated by the line Lc and that of the cylinder portion 45Aa is changed to the one indicated by the line L1c, which is very close to the thermal equilibrium state. As time is elapsed, the heat generated by the cathode heating element 42 and the auxiliary heating element 60, respectively, is further transferred as indicated by the arrows d1, and d3. Also, the supply of the current $i_2$ for the auxiliary heating element 60 is now stopped as explained above, and hence the temperature of the cylinder portion 45Aa is further lowered.

At time $t_{5a}$, the temperature distribution of the electron gun 12A becomes as shown in FIG. 8E. This indicates the thermal equilibrium state of the electron gun 12A. The time, $T_2$, required for the electron gun 12A to reach the thermal equilibrium state (i.e., time $t_{1a}$ to time $t_{5a}$) is about two hours. This is significantly short compared with the conventional electron beam exposure device 10 which takes about 12 hours to reach the equilibrium state.

Figure 9:
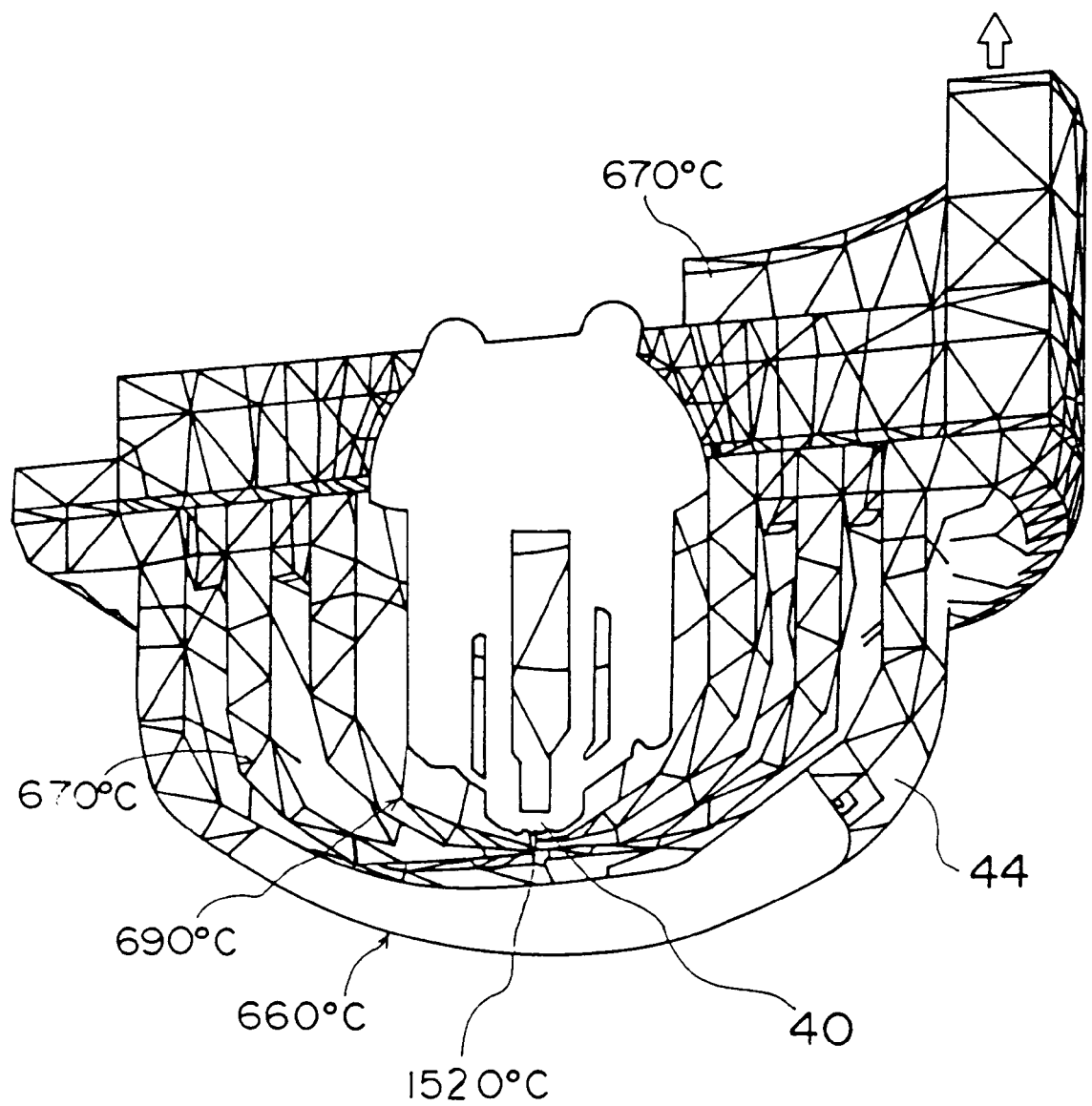
FIG. 9 is a diagram showing a temperature distribution of the supporting member and the Wehnelt of the electron gun.

After time $t_{5a}$, a current is constantly supplied to the cathode heating element 42 so that the quantity of heat generated by the cathode heating element 42 is substantially the same as the quantity of heat lost in the atmosphere through the upper portion 48A of the cylinder 11 from the base 45A. That is, the balance between the heat supply and the heat loss is maintained after time $t_{5a}$. Thus, the electron gun 12A may maintain the thermal equilibrium state indicated by the line VI shown in FIG. 8E (the temperature distribution state shown in FIG. 9).

Also, a deflection driving current is supplied to the alignment coil 20 and a lens current is supplied to the first electromagnetic lens 21 after the elapse of time $t_{5a}$ in order to perform an alignment adjustment while monitoring the output of the Faraday cap shown in FIG. 5. Then, an electron beam irradiation operation is started while carrying out a pattern correction of the cross section of the electron beam by using the output of the pattern correction circuit 33 and moving the stage 14 by the stage control unit 34. Thus, the electron beam irradiation may be started with less preparatory time compared with the conventional devices, and hence the working efficiency of the electron beam exposure device 10A is improved and the throughput of IC production may be increased.

Figure 10:
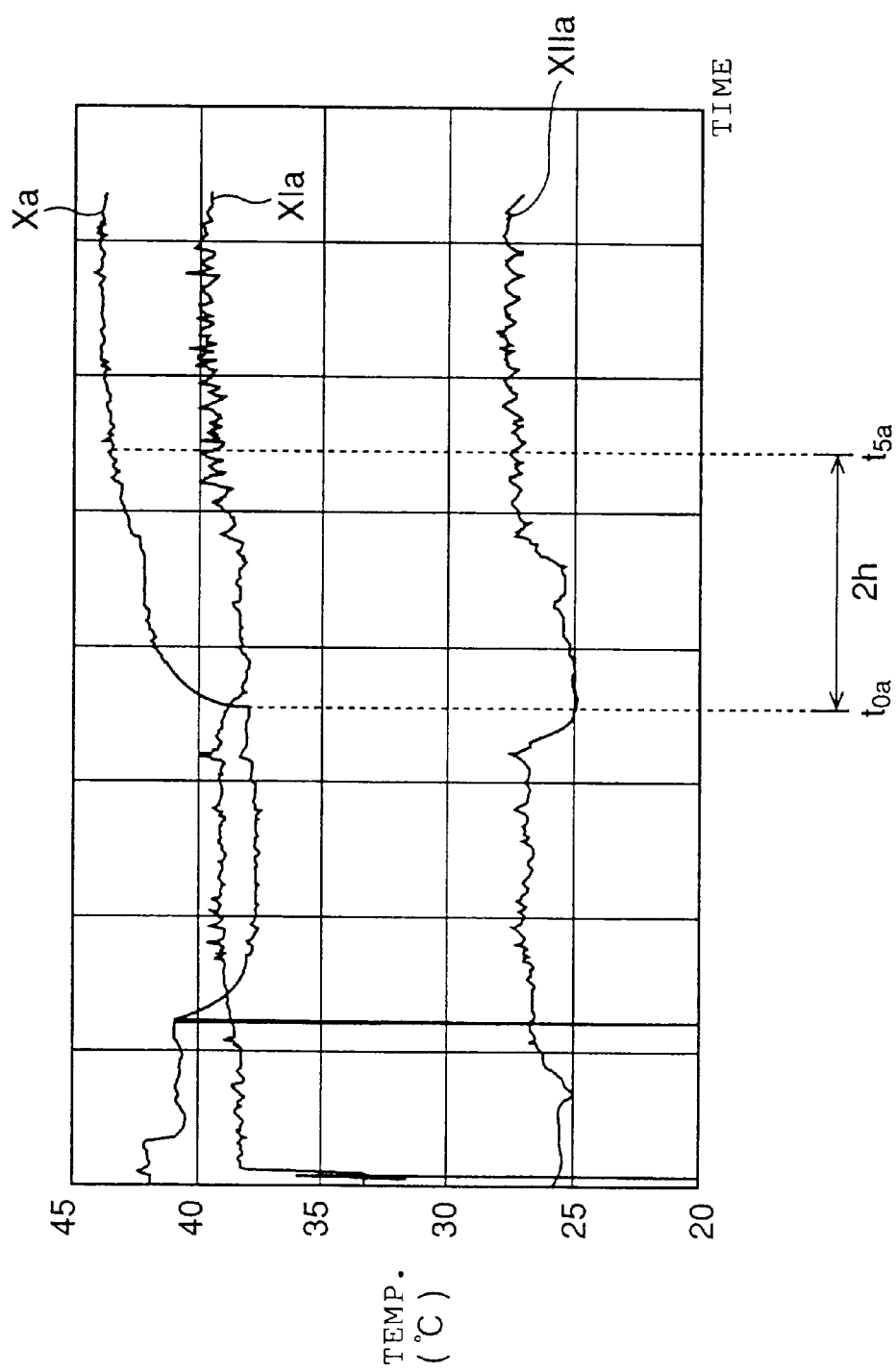
FIG. 10 is a graph showing a temperature change of the electron beam exposure device after its operation is restarted.

FIG. 10 is a graph showing the temperature change of the electron beam exposure device 10A after its operation is restarted (i.e., the time $t_0$ at which the power source is switched on and the cathode heating element 42 and the auxiliary heating element 60 are about to generate the heat—this is slightly before the above-mentioned time $t_{1a}$). The temperature of the outside of the electron beam exposure device 10A is measured. The line indicated by Xa indicates the temperature change of the position $P_1$ of the upper portion 48 of the mirror cylinder 11 and the line XIa indicates the temperature change of the position $P_2$ on the mirror cylinder 11. Likewise, the line XIIa indicates the temperature change at the position $P_3$ in a room where the electron beam exposure device 10A is located. As can be seen from the graph, the temperature of the upper portion 48 of the mirror cylinder 11 indicated by the line Xa is stabilized after about two hours from the time $t_0$.

Note that it is possible to locate the above mentioned auxiliary heating element 60 on the supporting member 43 or an electrode 61 instead of the cylinder portion 45Aa of the base 45.

Also, since no heat is generated by the auxiliary heating element 60 after time $t_{5a}$, the temperature of the upper portion 48A of the mirror cylinder 11 of the electron beam exposure device 10A is lowered compared with a case in which the auxiliary heating element 60 continues to generate the heat. That is, the temperature of the upper portion 48A of the cylinder 11 of the electron beam exposure device 10A is closer to the room temperature in the thermal equilibrium state. Thus, the electron beam exposure device 10A is less effected by the room (outside) temperature and the thermal equilibrium state is more stabilized.

On the other hand, it may be possible to reduce the time necessary for the electron beam exposure device 10A to reach the thermal equilibrium state by increasing the quantity of heat generation by the cathode heating element 42 instead of providing the auxiliary heating element 60. However, when the quantity of heat generated by the cathode heating element is increased, there is a danger that the temperature of the cathode which is made of $LaB_6$ crystal may exceed 1550° C. and the crystal may be melted. Thus, the quantity of heat generated by the cathode heating element 42 cannot be increased.

As mentioned above, the cooling water 81 of a constant temperature (usually about the room temperature) circulates along the cooling-water pathway 80 of the helical shape provided inside of the upper portion 48A of the cylinder 11, and hence the temperature of the upper portion 48A is maintained to be close to the room temperature. For this reason, the temperature of the upper portion 48A is hardly effected by the outside temperature and the thermal equilibrium state of the electron gun may be more stabilized.

Next, an electron beam exposure device according to a second embodiment of the present invention will be described with reference to FIGS. 11 through 15.

Figure 11:
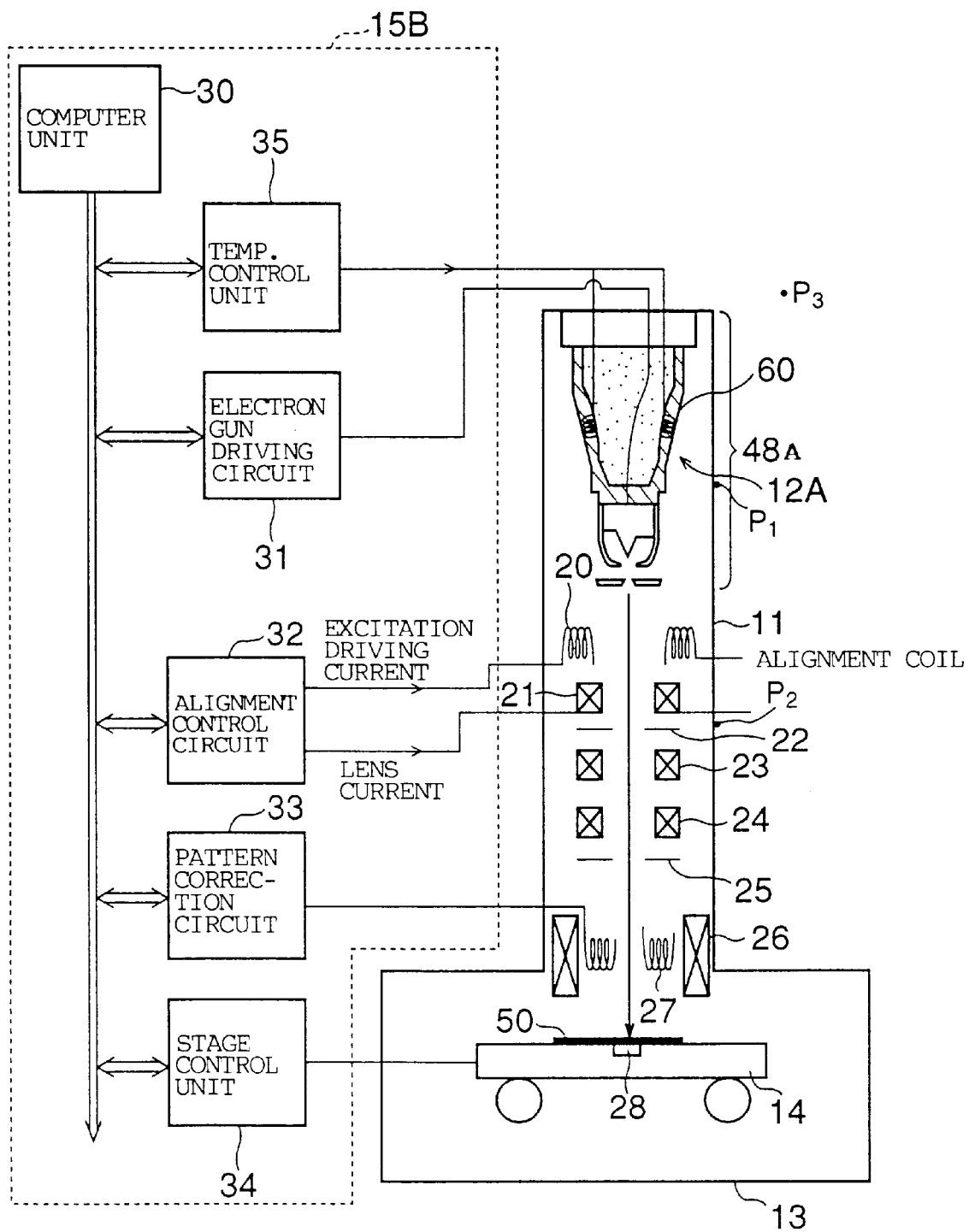
FIG. 11 is a diagram for explaining an electron beam exposure device according to a second embodiment of the present invention.

FIG. 11 is a diagram for explaining an electron beam exposure device 10B according to the second embodiment of the present invention.

The electron beam exposure device 10B according to the second embodiment is characterized by the function in which an electron beam irradiation operation may be performed before the electron gun reaches its thermal equilibrium state. In order to achieve this function, the electron beam irradiation operation may be carried out by using the time between one adjustment operation of the alignment optical system and the next adjustment operation of the alignment optical system during the process in which the electron gun reaches the thermal equilibrium state. However, if the electron beam irradiation operation is to be performed with a predetermined accuracy, it is required to carry out the adjustment operations of the alignment optical system with shorter intervals. As a result, the time which can be spared for the electron beam irradiation is reduced, and hence this idea is not practical.

According to the second embodiment of the present invention, a time interval between one adjustment operation of the alignment optical system and the next adjustment operation of the alignment optical system is increased while the accuracy of an electron beam irradiation operation is guaranteed.

The configuration of the electron beam exposure device 10B is the same as the electron beam exposure device 10A shown in FIG. 5 except the presence of a control circuit 15B instead of the control circuit 15A. The control circuit 15B used in the second embodiment of the present invention includes an alignment control circuit 32 in addition to the control circuit 15A shown in FIG. 5. That is, the electron beam exposure device 10B is also characterized by the software of the computer unit 30.

Figure 12:
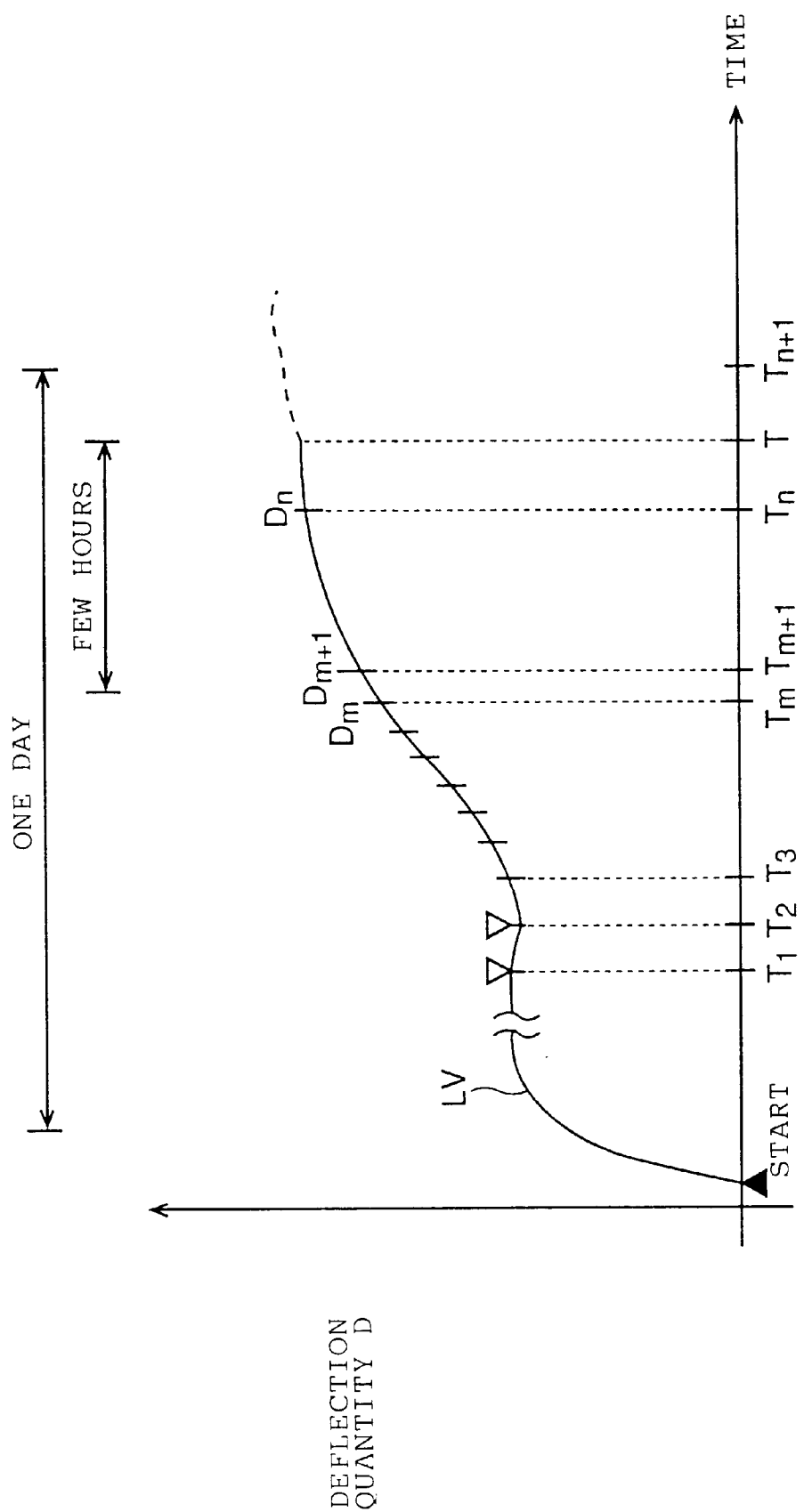
FIG. 12 is a graph showing a change in a deflection quantity D in a thermally non-equilibrium state of the electron beam exposure device, from a restarting operation to finally reaching a thermal equilibrium state, assuming that adjustment operations of the alignment optical system are carried out constantly.

FIG. 12 is a graph showing a change in a deflection quantity D in a thermally non-equilibrium state of the electron beam exposure device 10B from a restarting operation to finally reaching a thermal equilibrium state assuming that adjustment operations of the alignment optical system are carried out constantly.

Figure 13:
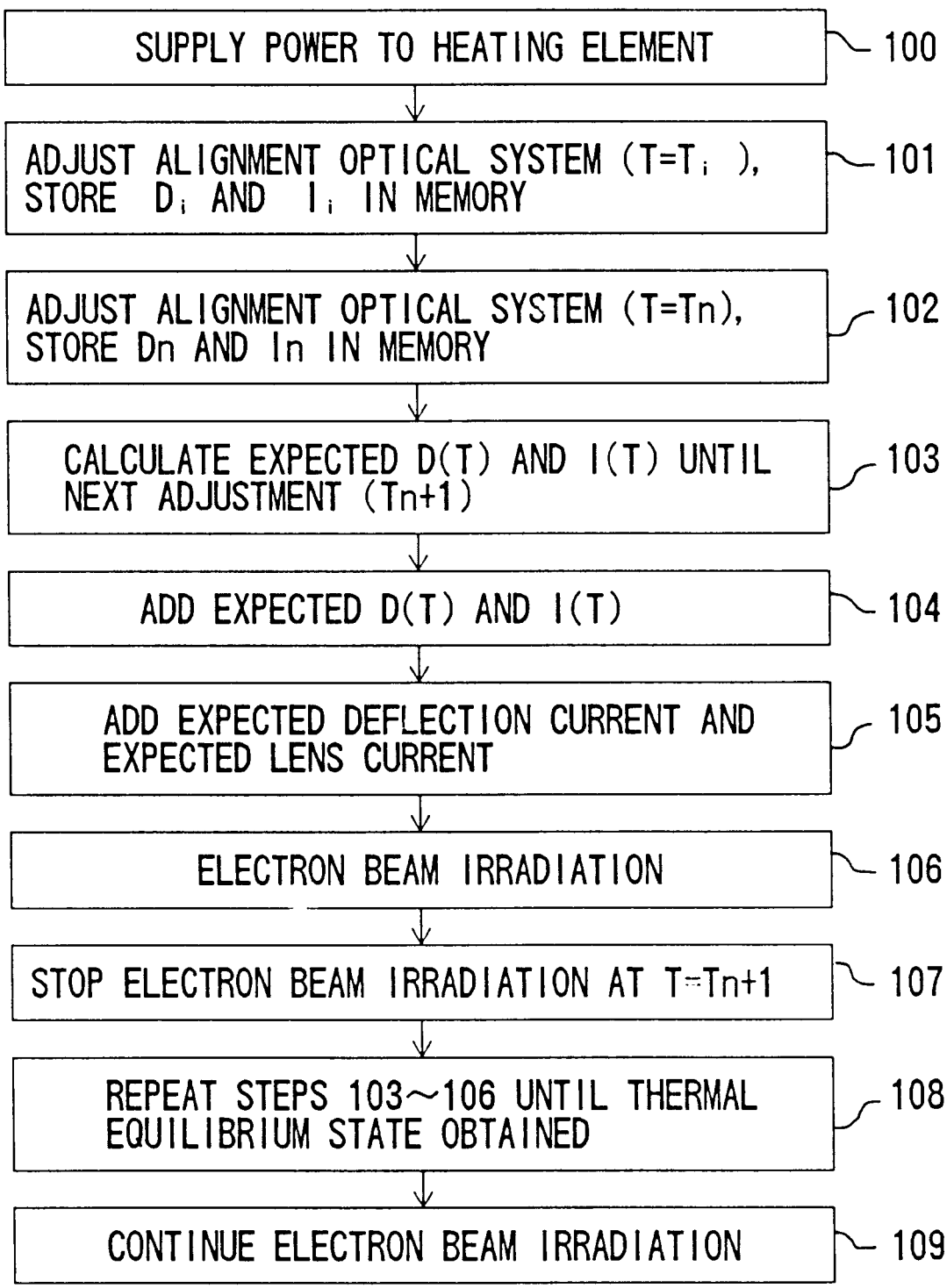
FIG. 13 is a flowchart for explaining the operation of the electron beam exposure device according to the second embodiment of the present invention.

FIG. 13 is a flowchart for explaining the operation of the electron beam exposure device 10B according to the second embodiment of the present invention.

As shown in FIG. 13, the power source is switched on first in order to supply a current to the cathode heating element 42 and the auxiliary heating element 60 in step 100.

Then, in step 101, the alignment optical system is adjusted so that the output of the Faraday cup 28, which has been monitored at a constant time interval (as shown in FIG. 12 as $T_1, T_2, \ldots$), becomes maximum, and information about the deflection quantity, Di, and the excitation current, Ii, at that time is stored in a memory.

After carrying out the adjustment operation for (n−1) times, an n-th adjustment of the alignment optical system is performed and information about the deflection quantity, Dn, and the excitation current, In, at that time is stored in a memory in step 102.

Then, the computer unit 30 performs steps 103 and 104. In step 103, an expected deflection quantity D(T) and an expected excitation current I(T) until the next Tn+1 adjustment are calculated. In step 104, the calculated values of the expected deflection quantity D(T) and the expected excitation current I(T) are given to the alignment control circuit 32.

In step 105, a calculated expected deflection current is supplied to the alignment coil 20 from the alignment control circuit 32 and a calculated expected lens current is supplied to the electromagnetic lens 21.

After this, an electron beam irradiation operation is carried out in step 106 and the electron beam irradiation operation is stopped when T becomes equal to Tn+1 in step 107.

The above-mentioned steps 103 to 107 are repeated until the electron gun 12A reaches a thermal equilibrium state in step 108. After the electron gun 12A reaches the thermal equilibrium state, the electron beam irradiation operation is continued in step 109.

Figure 14:
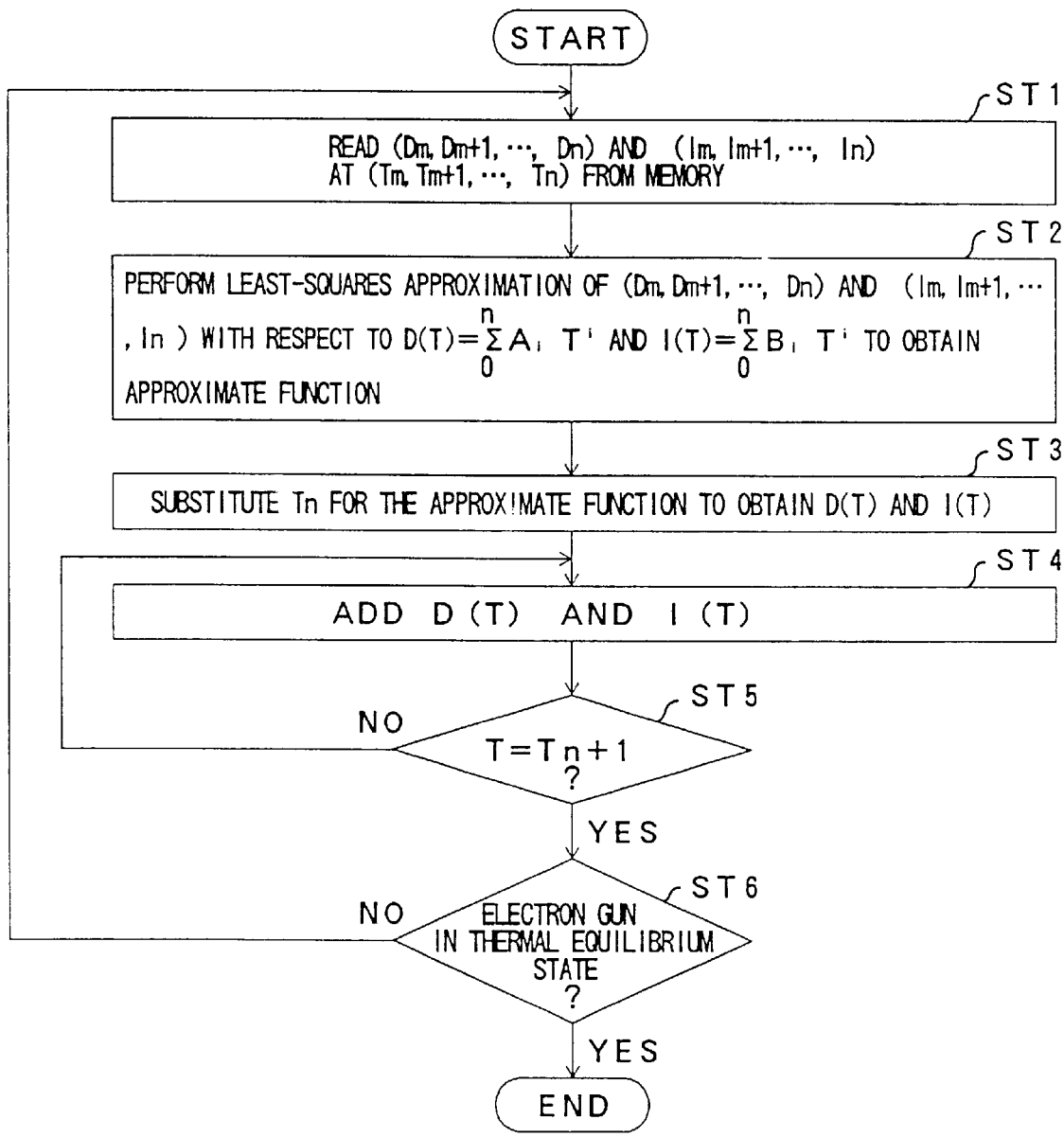
FIG. 14 is a flowchart for explaining practical operations in step 103 and 104 shown in FIG. 13.

Next, the operation of the computer unit 30 to achieve the above-mentioned steps 103 and 104 will be explained with reference to FIG. 14. FIG. 14 is a flowchart for explaining practical operations in step 103 and 104.

First, the deflection quantity (Dm, Dm+1, ... Dn) and the excitation current (Im, Im+1, ... In) at each time (Tm, Tm+1, ... Tn) from a certain time before (T=Tm) to the latest time (T=Tn) shown in FIG. 12 are read from the memory (ST1).

Then, the deflection quantity (Dm, Dm+1, ... Dn) and the excitation current (Im, Im+1, ... In) are least-squares approximated according to the following functions, respectively, in order to calculate Ai and Bi and obtain approximate functions (ST2):

$$D(T) = \sum_{0}^{N} AiT^i, \ I(T) = \sum_{0}^{N} BiT^i$$

After that, a current time Tn is substituted for the obtained approximate function in order to calculate the expected deflection quantity D(T) and the expected excitation current I(T) at the current time Tn (ST3).

Then, the calculated expected deflection quantity D(T) and the calculated expected excitation current I(T) are added to the alignment control circuit 32 (ST4).

In ST5, it is determined if T=Tn+1. If the answer is NO, then the process goes back to ST4. If the answer is YES, then it is determined if the electron gun 12A is in a thermal equilibrium state in ST6. If this answer is NO, then the process goes back to ST1. If the answer is YES, then the operation is terminated.

As mentioned above, according to the second embodiment of the present invention, the expected deflection quantity D(T) and the expected excitation current I(T) are obtained and the expected deflection current is supplied to the alignment coil 20 from the alignment control circuit 32 while the expected lens current is supplied to the electromagnetic lens 21. Note that the expected deflection quantity D(T) is an estimated value determined by changes which will be taking place, and not a value obtained by an adjustment operation which has just been carried out. Likewise, the expected excitation current I(T) is an estimated value determined by changes which will be taking place, and not a value obtained by an adjustment operation which has just been carried out. Therefore, the time required for reaching T=Tn+1 becomes longer compared with a case in which the alignment coil 20 and the electromagnetic lens 21, respectively, are adjusted based on the deflection quantity and the excitation current lately adjusted. Thus, the electron beam irradiation operation in step 106 may be carried out longer according to the present invention.

Next, a modified embodiment of the operation of the electron beam exposure device 10B after the completion of a maintenance operation and before the restart of the electron beam irradiation operation according to the present invention will be explained with reference to FIG. 15.

Figure 15:
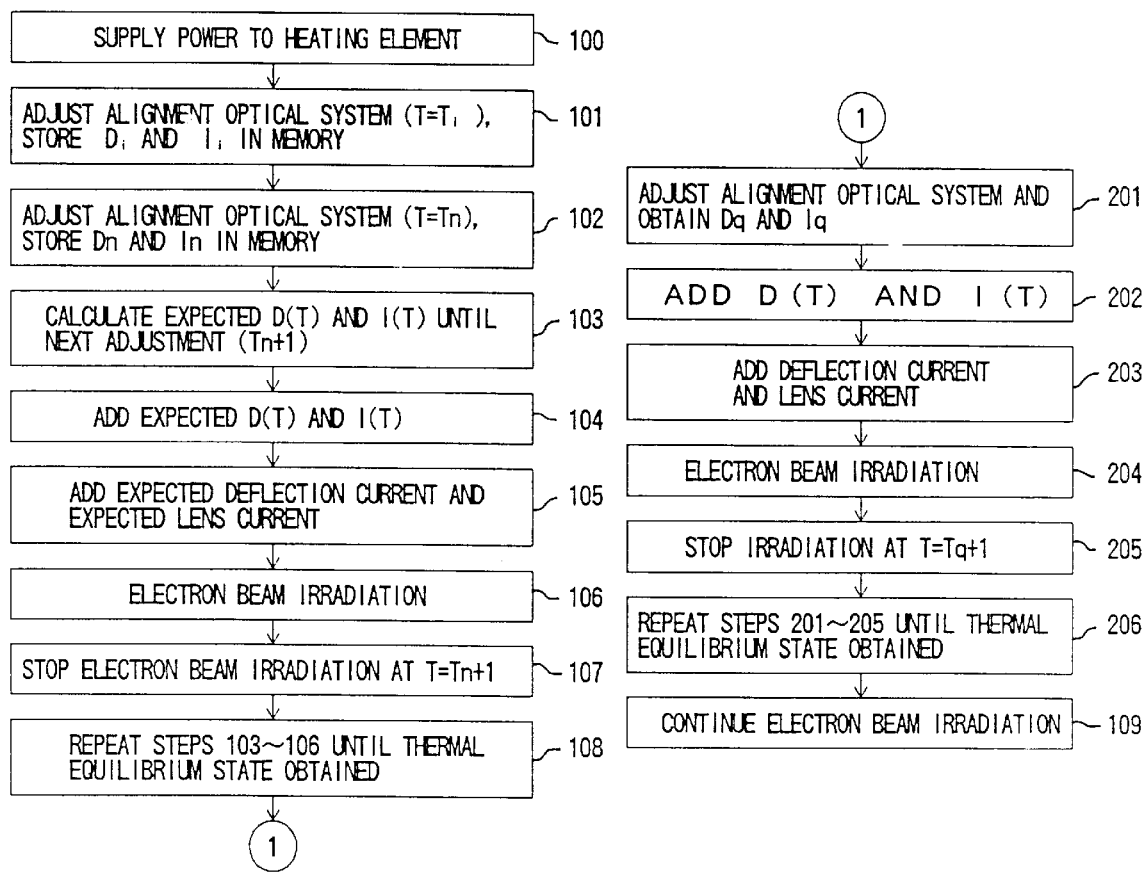
FIG. 15 is a diagram showing a flowchart for explaining the operation of the electron beam exposure device according to a modified embodiment of the present invention.

FIG. 15 is a diagram showing a flowchart for explaining the operation of the electron beam exposure device 10B according to the modified embodiment of the present invention. In FIG. 15, steps 100 through 108 are the same as the corresponding steps 100 through 108 shown in FIG. 13, and the explanation thereof will be omitted.

After the steps 103 to 107 are repeated until the electron gun 12A reaches a thermal equilibrium state in step 108, a deflection current based on the calculated deflection quantity D(T) may be supplied to the alignment coil 20. This is because the degree of change in the deflection quantity D(T) is significantly reduced when the thermal state of the electron gun 12A is close to an equilibrium state as shown in FIG. 12, and hence a relatively long irradiation time with a sufficient irradiation accuracy can be obtained if a deflection current based on the deflection quantity D(T) is used without calculating the expected deflection quantity.

Then, in step 201, the alignment optical system is adjusted so that the output of the Faraday cup 28, which has been monitored at a constant time interval (which is significantly longer than the time interval in step 101), becomes maximum, and information about the deflection quantity, Dq, and the excitation current, Iq, at that time is stored in a memory.

In step 202, the calculated values of the deflection quantity D(T) and the excitation current I(T) are supplied to the alignment control circuit 32.

In step 203, a deflection current is supplied to the alignment coil 20 from the alignment control circuit 32 and a lens current is supplied to the electromagnetic lens 21.

After this, an electron beam irradiation operation is carried out in step 204 and the electron beam irradiation operation is stopped when T becomes equal to Tn+1 in step 205.

The above-mentioned steps 201 to 205 are repeated until the electron gun 12A reaches a thermal equilibrium state in step 206.

After the electron gun 12A reaches the thermal equilibrium state, the electron beam irradiation operation is continued in step 109.

In addition, in the above explained second embodiment and modified embodiment of the present invention, the auxiliary heating element 60 may not be provided with the electron beam exposure device.

It is obvious that the present invention is not limited to the above-mentioned embodiments, and variations and modifications may be made without departing from the scope of the present invention.

What is claimed is:

1. An electron beam exposure device comprising:

an alignment optical system;

an electromagnetic lens system;

a stage on which a sample is provided; and an electron gun, said electron gun including:

an electron generating source;

an electron generating source heating element which generates heat for increasing the temperature of said electron generating source;

a supporting member which supports said electron generating source and said electron generating source heating element; and a Wehnelt, wherein at least one auxiliary heating element is provided at a respective portion thermally connected to said electron generating source heating element.

2. The electron beam exposure device as claimed in claim 1, further comprising a base which supports said Wehnelt, wherein said at least one auxiliary heating element is located in said base.

3. The electron beam exposure device as claimed in claim 1, further comprising an auxiliary heating element heating means for controlling a heating of said at least one auxiliary heating element.

4. The electron beam exposure device as claimed in claim 3, wherein said auxiliary heating element heating means controls heat quantity generated by said at least one auxiliary heating element so that the heat quantity generated by said at least one auxiliary heating element may be maintained substantially constant for a predetermined time after said electron generating source heating element starts to generate heat, and the heat quantity generated by said at least one auxiliary heating element is gradually decreased after said predetermined time has elapsed.

5. The electron beam exposure device as claimed in claim 4, wherein said auxiliary heating element heating means controls the heat quantity generated by said at least one auxiliary heating element so as to become substantially nil.

6. The electron beam exposure device as claimed in claim 1, further comprising a cylinder member which is provided so as to surround at least said electron gun, wherein at least one cooling-water pathway is provided in said cylinder member.

7. An electron beam exposure device comprising:

an alignment optical system;

an electromagnetic lens system;

a stage on which a sample is provided;

a computer unit; and an electron gun, said electron gun including:

an electron generating source;

an electron generating source heating element which generates heat for increasing the temperature of said electron generating source;

a supporting member which supports said electron generating source and said electron generating source heating element;

a Wehnelt; and a base which supports said Wehnelt, wherein said computer unit executes a computer program so as to perform an electron beam irradiation operation when said alignment optical system is adjusted and before said electron gun reaches a thermal equilibrium state.

* * * * *